(12) United States Patent
Cai et al.

(10) Patent No.: US 8,653,850 B2
(45) Date of Patent: Feb. 18, 2014

(54) APPARATUS AND METHOD FOR TESTING NUMBER OF TURNS ON COIL

(75) Inventors: Wei Cai, Beijing (CN); Weimin Zhang, Beijing (CN); Jiangtao Wang, Beijing (CN)

(73) Assignee: Jing-Jin Electric Technologies (Beijing) Co., Ltd., Chaoyang District Beijing (CN)

( * ) Notice: Subject to any disclaimer, the term of this patent is extended or adjusted under 35 U.S.C. 154(b) by 269 days.

(21) Appl. No.: 13/320,212

(22) PCT Filed: May 19, 2009

(86) PCT No.: PCT/CN2009/000541
§ 371 (c)(1),
(2), (4) Date: Nov. 11, 2011

(87) PCT Pub. No.: WO2010/130068
PCT Pub. Date: Nov. 18, 2010

(65) Prior Publication Data
US 2012/0169369 A1 Jul. 5, 2012

(30) Foreign Application Priority Data
May 13, 2009 (CN) .......................... 2009 1 0136688

(51) Int. Cl.
*G01R 31/06* (2006.01)
*H02P 1/00* (2006.01)
(52) U.S. Cl.
USPC ...................... 324/765.01; 324/545; 318/491
(58) Field of Classification Search
USPC ...................... 324/545, 546, 765.01; 310/198; 318/490–491; 73/861.08
See application file for complete search history.

(56) References Cited

U.S. PATENT DOCUMENTS

| | | | |
|---|---|---|---|
| 3,953,791 A * | 4/1976 | Spurr et al. ................... | 324/200 |
| 4,490,671 A | 12/1984 | Morong, III | |
| 2008/0315705 A1* | 12/2008 | Obata et al. ................... | 310/198 |

FOREIGN PATENT DOCUMENTS

| | | |
|---|---|---|
| CN | 87200470 | 12/1987 |
| CN | 2718596 | 8/2005 |
| GB | 2019015 | 10/1979 |
| JP | 62144081 | 6/1987 |
| JP | 8251873 | 9/1996 |
| JP | 2000245119 | 9/2000 |

* cited by examiner

*Primary Examiner* — Melissa Koval
*Assistant Examiner* — Farhana Hoque
(74) *Attorney, Agent, or Firm* — Boyle Fredrickson, S.C.

(57) ABSTRACT

An apparatus for testing number of turns, used for testing the number of turns of a winding coil on an electrical machine stator with concentrated winding, comprising: a base (6); a rod-shaped rotor bracket (4) around one end of which an excitation coil (1) is wound and around the other end of which a standard coil (2) is wound; a joining member for joining the base (6) with the rotor bracket (4) so that the base (6) and the rotor bracket (4) can rotate relative to each other, wherein the plane of the base (6) is parallel to the rotor bracket (4); a fixing member for fixing the electrical machine stator (5) with concentrated winding to the base (6) so as to make the stator (5) concentric and coplanar with the rotor bracket (4); a galvanometer (17) connected to the standard coil (2), which is connected to the tested coil (3) of the stator (5) in reverse polarity to form a loop during testing. Also provided is a method for using the apparatus to test the number of turns. The apparatus for testing number of turns has a simple structure, is of great utility and can test the number of turns of a winding coil on an electrical machine stator with concentrated winding directly.

10 Claims, 5 Drawing Sheets

APPARATUS AND METHOD FOR TESTING NUMBER OF TURNS ON COIL

FIELD OF THE INVENTION

The present invention relates to an apparatus and a method for testing number of turns, and more particularly, to an apparatus and a method for testing the number of turns of a coil on an electrical machine stator with concentrated winding.

BACKGROUND OF THE INVENTION

At present, electrical machines has their stators that are with distributed winding and concentrated winding. For an electrical machine stator with concentrated winding, the stator is of an annular form, its teeth protruding radially inwards are formed on the stator, and windings are wound around the teeth. During fabrication of the electrical machines with concentrated winding, and especially during the prototype production phase, the windings are usually wound manually. However, it is difficult to control the number of turns for manually wound windings, and it is possible that the number of turns obtained is more or less than the predetermined number of turns. Therefore, there exists an urgent need to test the number of turns of each coil on the stator with concentrated winding during the fabrication process of an electrical machine with concentrated winding.

SUMMARY OF THE INVENTION

In view of this, an objective of the present invention is to provide an apparatus that is capable of directly testing the number of turns of each coil on an electrical machine stator with concentrated winding and a testing method using the apparatus.

The present invention provides an apparatus for testing number of turns of each coil on an electrical machine stator with concentrated winding that comprises a base; a rod-shaped rotor bracket, around one side of which an excitation coil is wound and around the other side of which a standard coil is wound; a joining member for joining the base with the rotor bracket so that the base and the rotor bracket can rotate relative to each other, wherein the plane of the base is parallel to the rotor bracket; a fixing member for fixing the electrical machine stator with concentrated winding under test to the base so as to make the stator concentric and coplanar with the rotor bracket; and a galvanometer connected to the standard coil, which is connected to the coil of the electrical machine stator with concentrated winding under test in reverse polarity to form a loop during testing.

The present invention further provides a method for testing number of turns, using the aforesaid apparatus for testing number of turns to have a test, comprising: a step of fixing the base or the rotary shaft of the apparatus for testing number of turns; a step of fixing the electrical machine stator with concentrated winding so that the electrical machine stator with concentrated winding is fixed with respect to the base of the apparatus for testing number of turns; a step of positioning a tested coil by energizing the tested coil of the stator with concentrated winding so that the tested coil is positioned at a position that is in line with the rotor bracket of the apparatus for testing number of turns and the tested coil is close to one end of the standard coil of the rotor bracket; a step of circuit connection, in which the standard coil is connected to the tested coil in reverse polarity to form a loop and a galvanometer is connected in series in the loop; and a testing step, in which the excitation coil on the rotor bracket is energized by an alternating current and it is observed whether a reading of the galvanometer is zero. If the reading of the galvanometer is zero, it indicates that the number of turns of the tested coil is equal to that of the standard coil. Conversely, if a pointer of the galvanometer deflects to the positive side, it indicates that the number of turns of the tested coil is smaller than that of the standard coil and shall be increased; and if a pointer of the galvanometer deflects to the negative side, it indicates that the number of turns of the tested coil is greater than that of the standard coil and shall be decreased.

The apparatus for testing number of turns according to the present invention features a simple structure and great utility, and can directly test the number of turns of a winding coil on an electrical machine stator with concentrated winding. The method for using the apparatus for testing number of turns of the present invention can directly test the number of turns of a winding coil on an electrical machine stator with concentrated winding and is simple to operate.

DETAILED DESCRIPTION OF THE PREFERRED EMBODIMENT

Hereinbelow, embodiments of the present invention will be detailed with reference to the attached drawings.

Embodiment 1

Figure 1:
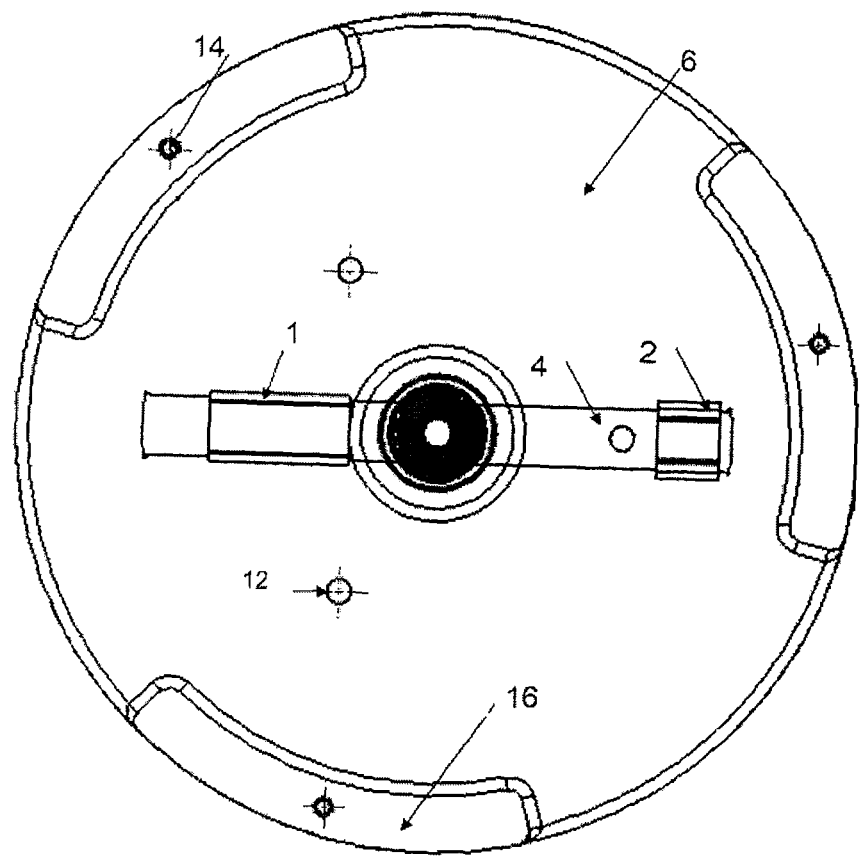
FIG. 1 is a top view of an apparatus for testing number of turns according to an embodiment of the present invention.
Figure 2:
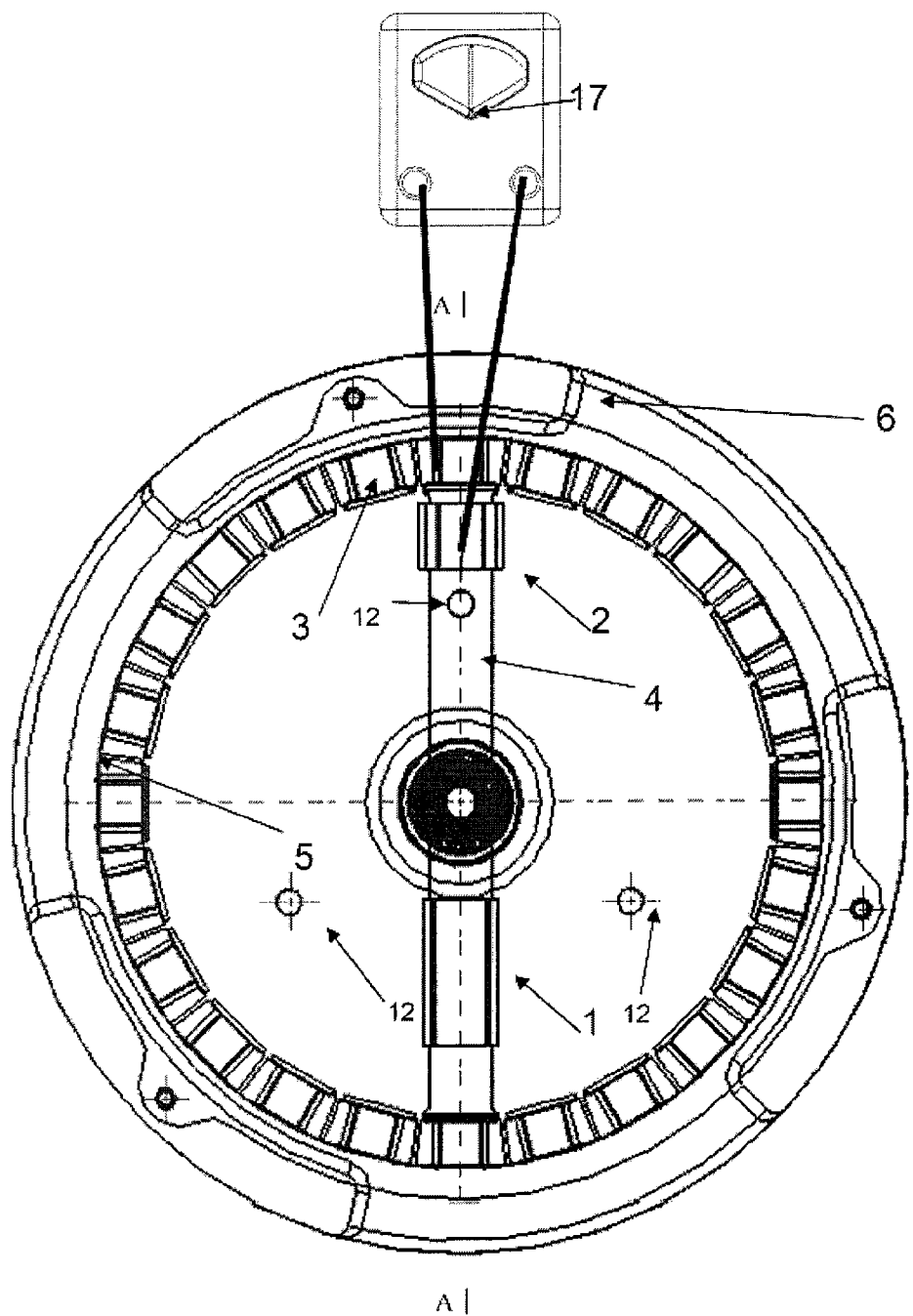
FIG. 2 is a top view of the apparatus for testing number of turns according to the embodiment of the present invention in use.
Figure 3:
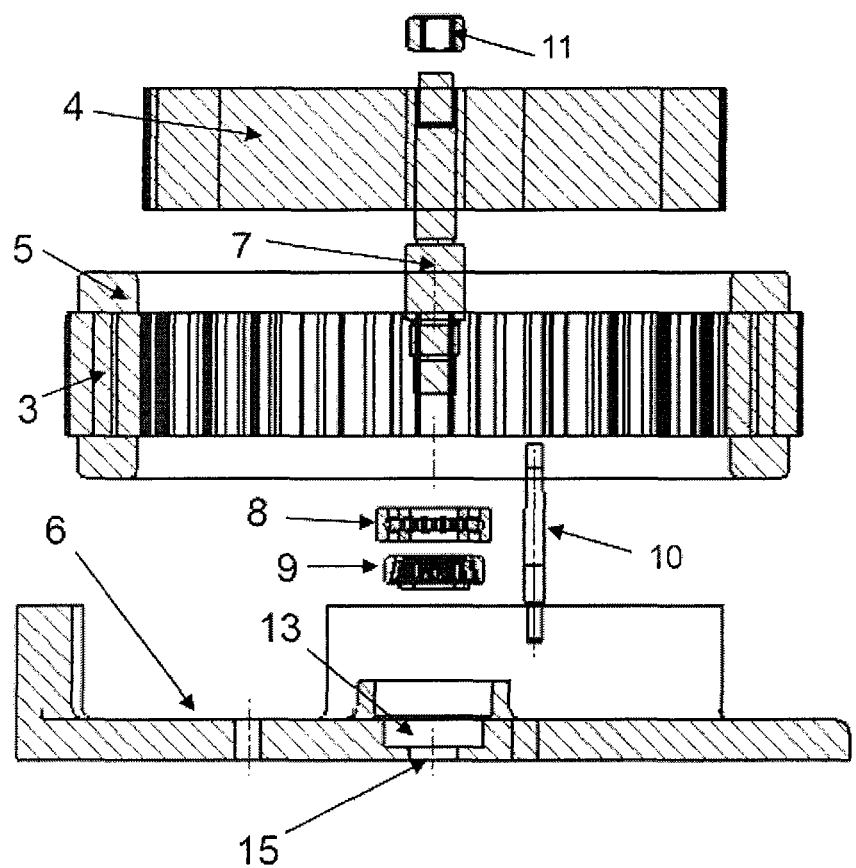
FIG. 3 is a schematic showing the exploded cross-sectional view taken along a line A-A in FIG. 2.

FIG. 1 is a top view of an apparatus for testing number of turns according to an embodiment of the present invention, FIG. 2 is a top view of the apparatus for testing number of turns (including the electrical machine stator with concentrated winding under test) according to the embodiment of the present invention, and FIG. 3 is a schematic showing the exploded cross-sectional view taken along a line A-A in FIG. 2. The apparatus for testing number of turns shown in the drawings is only illustrated as an example, and the present invention is not merely limited thereto.

The apparatus for testing number of turns according to the embodiment of the present invention comprises a base 6, a rotary shaft 7, a rotor bracket 4, an excitation coil 1, a standard coil 2, a fixing member and a galvanometer 17. In this embodiment, the fixing member adopts stator positioning pins 10. The base 6 is of a round-disc form, and a bearing chamber 13 for installation of a ball bearing 8 and a thrust bearing 9 therein and a center through-hole 15 whose cross-sectional area is smaller than the bearing chamber 13 are provided in the center of the base 6. At a periphery of the base 6 are formed three protrusion seats 16 for supporting the electrical machine stator with concentrated winding under test and for ensuring a constant distance between the electrical machine stator with concentrated winding under test and the base 6 during the test. Threaded holes 14 are formed in the protrusion seats 16 respectively and the three threaded holes 14 are spaced apart from each other by 120° with respect to the center of the base 6. Each of the stator positioning pins 10 has one end thereof engaged into a respective threaded hole 14 and the other end thereof used for engaging with the electrical machine stator 5 with concentrated winding under test. In production, the number of the protrusion seats 16, the number of the stator positioning pins 10 and the spacing therebetween with respect to the center of the base 6 may be determined as desired depending on practical conditions. The base 6 is further formed with fixing holes 12, by means of which the base 6 can be fixed on a platform. Another way of fixing is to provide, on the three protrusion seats 16, a spigot whose outer diameter is the same as the outer diameter of the electrical machine stator with concentrated winding so as to position the electrical machine stator with concentrated winding under test and to ensure that the stator with concentrated winding under test and the rotor bracket are concentric with each other.

The rotor bracket 4 is rod-shaped, and is formed with a center hole at a center thereof. On the rotor bracket 4, the excitation coil 1 is wound from a side of the center hole to the end of the rotor bracket 4, which is exposed outside of the excitation coil 1; the standard coil 2 is wound from the other side of the center hole and to the other end of the rotor bracket 4, which is exposed outside of the standard coil 2. The excitation coil 1 is connected to an external alternating current source (not shown) during testing, and when the excitation coil 1 is energized by an alternating current, the number of turns of wound coil may be adjusted according to a magnitude of the actual current in order to prevent saturation of the magnetic circuit so as to reduce the measurement error caused by the magnetic leakage. In theory, the number of turns of the standard coil 2 must be the same as the target number of turns of the tested coil 3; however, due to the magnetic field leakage in the magnetic circuit caused by the air gap, the actual number of turns of the standard coil 2 shall be determined according to results from practical tests, and the number of turns of the standard coil 2 is predetermined before the test.

One end of the rotary shaft 7 is fixed to the ball bearing 8 and the thrust bearing 9. The thrust bearing 9 is used to prevent axial movement of the rotary shaft 7, and the ball bearing 8 is used to ensure perpendicularity of the rotary shaft 7 with respect to the base 6 and the concentricity of the rotary shaft 7 with respect to the stator 5 of the electric machine. The other end of the rotary shaft 7 extends through the center hole of the rotor bracket 4, and the rotor bracket 4 is fixed by means of a fixing nut 11. During installation, the rotor bracket 4 is arranged to be perpendicular to the rotary shaft 7 so that the rotor bracket 4 is parallel to the plane of the base 6. During testing, the rotor bracket 4 that is fixed together with the rotary shaft 7 can rotate relative to the base 6.

During testing, the standard coil 2 is connected to the tested coil 3 in reverse polarity, i.e., an electromotive force induced in the standard coil 2 is opposite in direction to that induced in the tested coil 3. A galvanometer 17 is connected in series in the loop formed by the standard coil 2 and the tested coil 3, and the number of turns of the tested coil 3 is tested according to a reading of the galvanometer 17. If the reading of the galvanometer is zero, then it can be determined that the number of turns of the tested coil 3 is equal to that of the standard coil 2. However, if the pointer of the galvanometer deflects to the positive side, then it indicates that the number of turns of the tested coil 3 is smaller than that of the standard coil 2 and the number of turns of the tested coil shall be increased; and if the pointer of the galvanometer deflects to the negative side, then it indicates that the number of turns of the tested coil 3 is greater than that of the standard coil 2 and the number of turns of the tested coil shall be decreased.

Figure 5:
FIG. 5 is a schematic structural view of a positioning pin according to an embodiment of the present invention.

A schematic structural view of a stator positioning pin 10 of this embodiment is shown in FIG. 5. A lower end A of the stator positioning pin 10 may be of a threaded structure to be engaged with the threaded hole 14 of the base 6. A middle portion B of the stator positioning pin 10 has a larger cross-sectional area than the lower end A and is used to position the stator positioning pin 10. When the stator positioning pin 10 is threaded into the threaded hole 14 of the base 6, it can only be threaded to the greatest extent to a location where the middle portion B joins with the lower end A. Thus, concentricity of the stator 5 with concentrated winding under test can be ensured as long as the distance from the location where the middle portion B joins with the lower end A to the upper end C is the same for each stator positioning pin and each stator positioning pin 10 is threaded into the threaded hole 14 of the base 6 to the greatest extent. The upper end C may be of a polygonal structure such as a rectangular structure or square structure or a triangular structure, and is inserted into a positioning hole of a corresponding shape in the electrical machine stator with concentrated winding under test for purpose of being fixed to the electrical machine stator 5 with concentrated winding under test. This structure of the stator positioning pin 10 makes it convenient to install and replace. The length of each of the stator positioning pins 10 is able to ensure that when the electrical machine stator with concentrated winding under test is installed, the electrical machine stator with concentrated winding under test and the rotor bracket 4 lie in the same plane.

Embodiment 2

In this embodiment, the ball bearing 8 in the apparatus for testing number of turns is installed on the rotor bracket 4. That is, a bearing chamber may be located correspondingly in the rotor bracket 4, and the ball bearing 8 is located in the bearing chamber. The rotary shaft 7 has one end thereof fixed in the ball bearing 8 and the other end thereof fixed to the base 6. Thus, the rotary shaft 7 that is fixed together with the base 6 can rotate relative to the rotor bracket 4. Other structures are just similar to those of Embodiment 1, so they will not be further described herein.

Hereinbelow, a method for using the apparatus for testing number of turns of this embodiment to test the number of turns of a winding coil on an electrical machine stator with concentrated winding will be detailed.

The electrical machine stator 5 with concentrated winding under test is of an annular form having a plurality of teeth, e.g., 24 teeth, of course, the number of teeth on the electrical machine stator 5 with concentrated winding may be determined depending on practical needs, and tested coils 3 are wound on different teeth of the stator 5. During testing, the electrical machine stator 5 with concentrated winding can be fixed to the base 6 by the stator positioning pins 10 in such a way that the electrical machine stator 5 with concentrated winding is concentric and coplanar with the rotor bracket 4. Engaging holes to be engaged with the stator positioning pins 10 are provided at a periphery of the electrical machine stator 5 with concentrated winding so that, during installation, the stator positioning pins 10 engage with the engaging holes respectively to fix the stator 5 with concentrated winding under test. Thus, the electrical machine stator 5 with concentrated winding that is fixed together with the base 6 can rotate relative to the rotor bracket 4 and the rotary shaft 7 during testing. In the installation process, the rotor bracket 4 and the electrical machine stator 5 with concentrated winding under test is located on a same plane, and both air gaps between two end surfaces of the rotor bracket 4 and the electrical machine stator 5 with concentrated winding are made to be 0.2 mm or less to reduce magnetic leakage. Of course, the gaps may also be greater than 0.2 mm, when the air gaps is greater than 0.2 mm, the number of turns of the standard coil 2 may be adjusted through calculation to compensate for the affect of magnetic leakage caused by the air gaps.

Because tested coils 3 are wound on each tooth of the stator 5 of the electrical machine, two schemes may be adopted to test the number of turns of the tested coil 3.

In the first testing scheme, testing of the tested coils 3 on each tooth of the stator 5 is accomplished by rotating the rotor bracket 4.

In this scheme, the base 6 may be fixed on a platform by means of screws through the fixing holes 12.

The electrical machine stator 5 with concentrated winding under test is fixed to the base 6. As described above, the electrical machine stator 5 with concentrated winding under test may be fixed to the base 6 by means of the stator positioning pins 10, and the electrical machine stator with concentrated winding under test can also be positioned by means of a spigot additionally formed on the three protrusion seats 16 and having an outer diameter identical to an outer diameter of the electrical machine stator 5 with concentrated winding under test. In this way, the base 6 and the electrical machine stator 5 with concentrated winding under test fixed thereto can be kept stationary so that the rotor bracket 4 rotates when the tested coil 3 is energized.

When it is desired to test the tested coil 3 on a certain tooth of the electrical machine stator 5 with concentrated winding under test, the tested coil 3 on this tooth is positioned firstly, i.e., the tested coil 3 on the tooth near the standard coil 2 is energized so that the standard coil 2 on the rotor bracket 4 rotates to a position corresponding to the tested coil 3 (i.e., the rotor bracket 4 is in line with the tested coil 3). Alternatively, the rotor bracket 4 may also be in line with the tested coil 3 mechanically.

Next, the standard coil 2 and the tested coil 3 are connected in reverse polarity (i.e., the electromagnetism induced in the standard coil 2 is opposite in direction to that induced in the tested coil 3), and a galvanometer 17 is connected in series between the standard coil 2 and the tested coil 3. Then, the excitation coil 1 is connected to an alternating current source.

Figure 4:
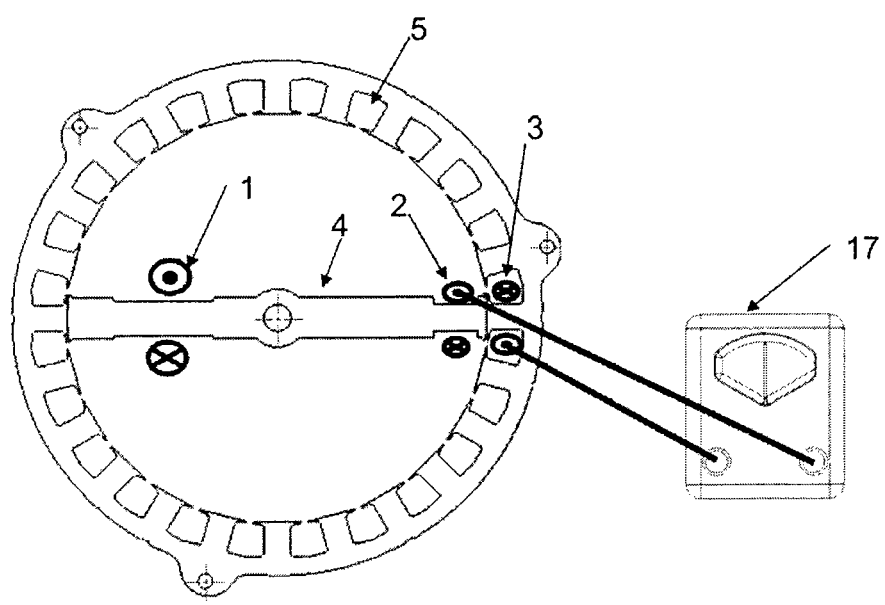
FIG. 4 is a view illustrating current flow directions in coils of an electrical machine stator and a rotor bracket during testing.

During testing, an alternating current of a certain frequency is applied to the excitation coil 1, when the excitation coil 1 is energized by an alternating current, the excited magnetic field may generate induced electromotive forces in the standard coil 2 and the tested coil 3 respectively. Current flow directions in the excitation coil 1, the standard coil 2 and the tested coil 3 are shown in FIG. 4 respectively. Because the induced current in a coil is in direct proportion to the number of turns of the coil, so currents induced in coils having the same number of turns will be identical in magnitude to each other. In this testing scheme, the standard coil 2 and the tested coil 3 are connected reversely, so the current induced in the standard coil 2 is opposite in direction to that induced in the tested coil 3 and, correspondingly, the current induced in the standard coil 2 offsets the current induced in the tested coil 3 in the loop formed by the standard coil 2 and the tested coil 3. If the number of turns of the standard coil 2 is equal to that of the tested coil 3, then magnitude of the current induced in the standard coil 2 will also be equal to that of the tested coil 3 and, correspondingly, the resultant current in the loop formed by the standard coil 2 and the tested coil 3 will become zero.

Based on the aforesaid principle, in this testing scheme, the number of turns of the tested coil 3 can be determined by observing the deflection direction and the deflection amount of the pointer on the galvanometer 17. If the standard coil 2 and the tested coil 3 have the same number of turns, then the reading of the galvanometer 17 is zero; conversely, the reading of the galvanometer 17 is not zero. Specifically, when the pointer of the galvanometer 17 deflects to the positive side, it indicates that the number of turns of the tested coil 3 is smaller than that of the standard coil 2 and, correspondingly, shall be increased until the reading of the galvanometer 17 becomes zero; and when the pointer of the galvanometer 17 deflects to the negative side, it indicates that the number of turns of the tested coil 3 is greater than that of the standard coil 2 and, correspondingly, shall be decreased until the reading of the galvanometer 17 becomes zero.

In a second testing scheme, testing of tested coils 3 on each tooth of the stator 5 of the electrical machine is accomplished by rotating the stator 5 of the electrical machine. This scheme differs from the first testing scheme in that the rotary shaft 7 and the rotor bracket 4 fixed thereto are kept stationary while the base 6 and the stator 5 of the electrical machine fixed thereto rotate relative to the rotor bracket 4.

In this scheme, the one end of the rotary shaft 7 fixed in the ball bearing 8 and the thrust bearing 9 may further extend out of the center through-hole 15 of the base 6 and fixed on a platform so that the rotary shaft 7 and the rotor bracket 4 fixed thereto are kept stationary on the platform. Then, when the tested coil 3 is energized, the base 6 and the stator 5 of the electrical machine fixed thereto will rotate relative to the rotor bracket 4.

When it is desired to test the tested coil 3 on a certain tooth of the stator 5 of the electrical machine, the tested coil 3 is positioned firstly, i.e., the tested coil 3 on the tooth near the standard coil 2 is energized so that the stator 5 rotates to a position where the tested coil 3 opposes to the rotor bracket 4 (i.e., the rotor bracket 4 is in lines with the tested coil 3).

Other testing steps and testing principle of this scheme are all similar to those of the first testing scheme, so they will not be further described herein.

The apparatus for testing number of turns according to this embodiment features a simple structure and great utility, and can directly test the number of turns of a winding coil on an electrical machine stator with concentrate winding. The method for testing the number of turns of a winding coil on an electrical machine stator with concentrate winding according to this embodiment can directly test the number of turns of the winding coil on the electrical machine stator with concentrated winding and is simple to operate.

The electrical machine stator with concentrated winding and the base are fixed to each other by means of stator positioning pins; of course, they may also be fixed to each other by means of other fixing members such as screws or through snap-fitting.

Additionally, although three stator positioning pins 10 are used to fix the electrical machine stator 5 with concentrated winding in the embodiments described above, of course, four, five or more stator positioning pins 10 may also be used to fix the electrical machine stator 5 with concentrated winding depending on practical needs.

Furthermore, although three protrusion seats 16 are located at the periphery of the base 6 in the embodiments described above, the number of the protrusion seats 16 is not limited to three so long as it can be ensured that a constant distance is kept between the electrical machine stator 5 with concentrated winding under test and the base 6. Alternatively, one end of each stator positioning pin 10 of the electrical machine electrical machine stator 5 with concentrated winding under test may be located on the base directly with the protrusion seats 16 being omitted.

Moreover, although the ball bearing 8 and the thrust bearing 9 are used to fix the rotary shaft 7 in the embodiments described above, the thrust bearing 9 may also be omitted as long as it can be ensured that the rotary shaft 7 will not move axially. For example, a wide ball bearing may be used to position the rotor bracket 4.

The embodiments of the present invention are provided only as examples but are not intended to limit the present invention. There may be other embodiments of the present invention, and various changes and variations may be made on these embodiments by those skilled in the art without departing from the spirits and essence of the present invention, and these changes and variations shall all fall within the scope of the present invention.

The invention claimed is:

1. An apparatus for testing number of turns, used for testing the number of turns of a winding coil on an electrical machine stator with concentrated winding, comprising:
    a base;
    a rod-shaped rotor bracket, around one side of which an excitation coil is wound and around the other side of which a standard coil is wound;
    a joining member for joining the base with the rotor bracket so that the base and the rotor bracket can rotate relative to each other, wherein a plane of the base is parallel to the rotor bracket;
    a fixing member for fixing the electrical machine stator with concentrated winding under test to the base so as to make the electrical machine stator with concentrated winding under test concentric and coplanar with the rotor bracket; and
    a galvanometer connected to the standard coil, which is connected to the tested coil on the electrical machine stator with concentrated winding under test in reverse polarity to form a loop during testing.

2. The apparatus for testing number of turns according to claim 1, wherein
    the joining member comprises a ball bearing and a rotary shaft, and
    one end of the rotary shaft is fixed in the ball bearing and the other end of the rotary shaft is fixed to the rotor bracket, and
    the ball bearing is installed in the base.

3. The apparatus for testing number of turns according to claim 2, wherein
    the other end of the rotary shaft passes through a center hole of the rotor bracket and is fixed by a nut.

4. A method for testing number of turns, using the apparatus for testing number of turns of claim 2 to test a winding coil on an electrical machine stator with concentrated winding, comprising:
    a step of fixing the rotary shaft of the apparatus for testing number of turns, in which the one end of the rotary shaft of the apparatus for testing number of turns that is fixed in the ball bearing is fixed to a platform through a through-hole in the base;
    a step of fixing the electrical machine stator with concentrated winding so that the electrical machine stator with concentrated winding is fixed with respect to the base of the apparatus for testing number of turns;
    a step of positioning a tested coil by energizing the tested coil on the electrical machine stator with concentrated winding so that the tested coil is positioned at a position that is in line with the rotor bracket of the apparatus for testing number of turns and the tested coil is close to one end of the standard coil of the rotor bracket;
    a step of circuit connection, in which the standard coil is connected reversely to the tested coil to form a loop and a galvanometer is connected in series in the loop; and
    a testing step, in which the excitation coil on the rotor bracket is energized by an alternating current and it is observed whether a reading of the galvanometer is zero.

5. The apparatus for testing number of turns according to claim 1, wherein
    the joining member comprises a ball bearing and a rotary shaft, and
    one end of the rotary shaft is fixed in the ball bearing and the other end of the rotary shaft is fixed to the base, and
    the ball bearing is installed in the rotor bracket.

6. The apparatus for testing number of turns according to claim 1, wherein
    both gaps between two end surfaces of the rotor bracket and the electrical machine stator with concentrated winding under test are no greater than 0.2 mm.

7. The apparatus for testing number of turns according to claim 1, wherein
    one end of the fixing member is of a threaded structure that is engaged with a threaded hole of the base, and a cross section of the other end of the fixing member is of a polygonal structure that is inserted into an engaging hole having a corresponding shape in the electrical machine stator with concentrated winding under test.

8. The apparatus for testing number of turns according to claim 1, wherein
    three said fixing members are provided and spaced apart from each other by 120 degree.

9. A method for testing number of turns, using the apparatus for testing number of turns of claim 1 to test a winding coil on an electrical machine stator with concentrated winding, comprising:
    a step of fixing the base of the apparatus for testing number of turns;
    a step of fixing the electrical machine stator with concentrated winding so that the electrical machine stator with concentrated winding is fixed with respect to the base of the apparatus for testing number of turns;
    a step of positioning a tested coil by energizing the tested coil on the electrical machine stator with concentrated winding so that the tested coil is positioned at a position that is in line with the rotor bracket of the apparatus for testing number of turns and the tested coil is close to one end of the standard coil of the rotor bracket;
    a step of circuit connection, in which the standard coil is connected reversely to the tested coil to form a loop and a galvanometer is connected in series in the loop; and
    a testing step, in which the excitation coil on the rotor bracket is energized by an alternating current and it is observed whether a reading of the galvanometer is zero.

10. The method for testing number of turns according to claim 9, wherein
    in the testing step, if the reading of the galvanometer is not zero, then increasing or decreasing the tested coil until the reading of the galvanometer becomes zero.

* * * * *